(12) United States Patent
Tseng et al.

(10) Patent No.: US 10,658,458 B2
(45) Date of Patent: May 19, 2020

(54) SEMICONDUCTOR STRUCTURE AND METHOD OF FORMING THE SAME

(71) Applicant: UNITED MICROELECTRONICS CORP., Hsin-Chu (TW)

(72) Inventors: I-Ming Tseng, Kaohsiung (TW); Chun-Hsien Lin, Tainan (TW); Wen-An Liang, Tainan (TW)

(73) Assignee: UNITED MICROELECTRONCIS CORP., Hsin-Chu (TW)

( * ) Notice: Subject to any disclaimer, the term of this patent is extended or adjusted under 35 U.S.C. 154(b) by 0 days.

(21) Appl. No.: 16/028,386

(22) Filed: Jul. 5, 2018

(65) Prior Publication Data

US 2018/0331177 A1 Nov. 15, 2018

Related U.S. Application Data

(62) Division of application No. 15/249,462, filed on Aug. 28, 2016, now Pat. No. 10,043,868.

(30) Foreign Application Priority Data

Aug. 3, 2016 (TW) .............................. 105124552 A

(51) Int. Cl.
*H01L 21/762* (2006.01)
*H01L 29/06* (2006.01)
(Continued)

(52) U.S. Cl.
CPC .... *H01L 29/0653* (2013.01); *H01L 21/76224* (2013.01); *H01L 21/823431* (2013.01);
(Continued)

(58) Field of Classification Search
CPC ........... H01L 21/76224; H01L 29/0653; H01L 29/66795; H01L 29/7851; H01L 21/823431; H01L 29/785
See application file for complete search history.

(56) References Cited

U.S. PATENT DOCUMENTS 9,136,178 B2 9/2015 Li
2005/0054204 A1* 3/2005 Yu .......................... H01L 21/308
438/700

(Continued)

FOREIGN PATENT DOCUMENTS

TW 201442147 A 11/2014
TW 201612972 A 4/2016
TW 201626571 A 7/2016

OTHER PUBLICATIONS

Huang, Title of Invention: Patterned Structure of a Semiconductor Device and a Manufacturing Method Thereof, U.S. Appl. No. 14/710,602, filed May 13, 2015.

*Primary Examiner* — Matthew C Landau
*Assistant Examiner* — Dmitriy Yemelyanov
(74) *Attorney, Agent, or Firm* — Winston Hsu

(57) ABSTRACT

A method of forming a semiconductor structure is disclosed. A fin structure is formed on a substrate and a trench is formed in the fin structure. The trench has a top corner, an upper portion having an upper sidewall and a lower portion having a lower sidewall. A first dielectric layer is then formed on the substrate and fills the lower portion of the trench. After that, a second dielectric layer is formed on the substrate and covers the top corner and the upper sidewall of the trench. The second dielectric layer also covers an upper surface of the first dielectric layer.

10 Claims, 11 Drawing Sheets

(51) Int. Cl.
*H01L 21/8234* (2006.01)
*H01L 29/78* (2006.01)
*H01L 29/66* (2006.01)

(52) U.S. Cl.
CPC ........... *H01L 21/823481* (2013.01); *H01L 29/66795* (2013.01); *H01L 29/785* (2013.01); *H01L 29/7851* (2013.01)

(56) References Cited

U.S. PATENT DOCUMENTS

| | | | |
|---|---|---|---|
| 2007/0138599 A1* | 6/2007 | Ahn | H01L 27/10876 257/618 |
| 2012/0256259 A1 | 10/2012 | Surthi | |
| 2013/0187237 A1 | 7/2013 | Yu | |
| 2013/0277743 A1 | 10/2013 | Jagannathan | |
| 2014/0035066 A1* | 2/2014 | Tsai | H01L 29/66795 257/401 |
| 2014/0117462 A1* | 5/2014 | Cheng | H01L 29/66803 257/410 |
| 2015/0214341 A1 | 7/2015 | Shin | |

\* cited by examiner (a)

(b)

SEMICONDUCTOR STRUCTURE AND METHOD OF FORMING THE SAME

CROSS REFERENCE TO RELATED APPLICATIONS

This is a division of U.S. application Ser. No. 15/249,462 filed on Aug. 28, 2016. The above-mentioned applications are included in their entirety herein by reference.

BACKGROUND OF THE INVENTION

1. Field of the Invention

The present invention generally relates to semiconductor structure and method of forming the same, and more particularly, to an isolation structure of a semiconductor structure and the method of forming the same.

2. Description of the Prior Art

In advanced semiconductor technology, fin field effect transistors (Fin FET) have taken the place of traditional planar transistors and have become the mainstream of development. Generally, at the beginning of forming a fin FET, trenches are formed in a semiconductor substrate by patterning processes, such as a photolithograph-etching process (PEP), to transfer the pattern of a design layout to the semiconductor substrate wherein areas of fin structures are defined in the semiconductor substrate by the trenches. Insulating materials are then formed and filling into the trenches to form an isolation structure between the fin structures. Afterward, gate structures crossing over the fin structures may be formed, and the overlap regions of the fin structures and the gate structures are the channel regions of the fin FETs. To improve device performance, a strained silicon structure may be formed at each side of the gate structures to be the source/drain region.

With the development of semiconductor technology, the sizes of semiconductor devices continue to shrink for better performance, higher degree of integration and better economic benefit. To fabricate the semiconductor devices comprising finer fin structures and small pitches, multiple-patterning technologies have been proposed and widely adopted for better resolution and avoiding the deformation result from etching loading effect, such as photolithography-etch-photolithography-etch (2P2E) process, photolithography-photolithography-etch (2P1E) process or spacer self-aligned double-patterning (SADP) process. For example, as shown in FIG. 1, a first patterning process is carried out to define an array of fin structures 10 on the substrate 1, wherein a plurality of fin structures extending along the same direction are arranged in close proximity to each other and separated by the trenches 20 formed therebetween. Afterward, a second patterning process is carried out, for example, to remove the dummy fin structures 10a and 10b to form wider trenches 21 thereby. Subsequently, a third patterning process may be performed, for example, to form the trenches 22, 24 and 26 to divide the fin structures into fin segments (or sections). After the multiple-patterning processes aforesaid, the trenches 20, 21, 22, 24, 26 may be filled with an insulating material, and a planarization process may then be performed, to remove the excess insulating material and form the isolation structures. The fin segments formed by the multiple-patterning technology may be more uniform in dimensions and may have tapered cross-sectional profiles. Conventional line end shorting or narrowing problem caused by optical proximity effect (OPE) is prevented. The fin segments formed on the substrate by the multiple-patterning technology may have similar cross-sectional profiles regardless of variations in patterning densities and pitches.

However, with the trend of device shrinking, the widths of the trenches may be also scaled down. Regarding the trench used to segment fin structures, such as the trench 24, smaller width may make the adjacent distal ends of two fin segments, such as 10c and 10d, be so close that the risk of epitaxial bridging among them is increased. Similarly, for the purpose of device shrinking, the source/drain contact plugs may be disposed very close to the distal ends of fin segments. Unfortunately, facet defects are found more often in the epitaxial structures near the distal ends of the fin segment and therefore result in poor landing of the source/drain contact plugs.

Therefore, there is still a need in the field to provide an improved isolation structure used in dividing the fin structures into a plurality of fin segments. The isolation structure may preferably have a smaller width to achieve a smaller layout area, and furthermore, may be able to prevent the epitaxial bridging issue between the adjacent distal ends of the closely spaced fin segments and improve the yield of the source/drain contact plugs disposed at the distal ends.

SUMMARY OF THE INVENTION

One objective of the present invention is to provide a semiconductor structure, and more particularly, a semiconductor structure including an isolation structure formed in a fin structure.

According to one embodiment, a semiconductor structure is provided, including a fin structure disposed on a substrate, and an isolation structure formed in the fin structure. The isolation structure includes a trench and a first dielectric layer partially filling the trench. The trench has a rounded top corner, an upper portion with a concave upper sidewall, and a lower portion with a straight lower sidewall, wherein the first dielectric layer fills the lower portion and has a concave upper surface. A second dielectric layer is formed covering the upper sidewall and the top corner of the trench and the upper surface of the first dielectric layer.

According to another embodiment, the semiconductor structure further comprises a gate body disposed on the fin structure, aligned with the trench and completely covering the trench. A spacer is disposed on two opposite sidewalls of the gate body. A gate dielectric layer is disposed between the spacer and the fin structure. The gate body fills the upper portion of the trench and has a bottom surface lower than the fin structure by 50 to 100 angstroms.

According to still another embodiment, the second dielectric layer is sandwiched in between the gate body, the upper surface of the first dielectric layer, the upper sidewall and the top corner of the trench, wherein a portion of the second dielectric layer adjacent to the top corner of the trench has a bird's peak profile.

Another objective of the present invention is to provide a method of forming a semiconductor structure, and more particularly, a method of forming an isolation structure in a fin structure.

According to one embodiment, the method of forming a semiconductor structure includes the following steps. First, a fin structure is formed on a substrate. Subsequently, a trench is formed in the fin structure, wherein the trench has a top corner, an upper portion with an upper sidewall, and a lower portion with a lower sidewall. Next, a first dielectric layer is formed filling the lower portion of the trench. After that, a second dielectric layer is formed covering the top corner and the upper sidewall of the trench and an upper surface of the first dielectric layer. According to the embodiment, the top corner of the trench is a rounded top corner, the upper sidewall of the upper portion of the trench is a concave upper sidewall, the lower sidewall of the lower portion of the trench is a straight lower sidewall, and the upper surface of the first dielectric layer is a concave upper surface.

According to another embodiment, a portion of the second dielectric layer adjacent to the top corner of the trench has a bird's peak profile.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIG. 2 to FIG. 11 are schematic diagrams, illustrating the method of forming a semiconductor structure according to one embodiment of the present invention, wherein:

FIG. 2 is a schematic diagram of the semiconductor structure after trenches and fin structures are formed on a substrate, wherein FIG. 2(a) is a top view of the semiconductor structure, FIG. 2(b) is a cross-sectional view taken along line A-A' in FIG. 2(a), and FIG. 2(c) is a cross-sectional view taken along line B-B' in FIG. 2(a);

FIG. 3 is a cross-sectional view of the semiconductor structure after a first dielectric material layer is formed;

FIG. 4 is a cross-sectional view of the semiconductor structure after a portion of the first dielectric material layer is removed and a well region is formed in the substrate;

FIG. 5 is a cross-sectional view of the semiconductor structure wherein a first dielectric layer is formed filling a lower portion of the trench and a gate dielectric layer is formed conformally covering the first dielectric layer and the fin structure;

FIG. 6 is a schematic diagram of the semiconductor structure after gate structures are formed on the substrate, wherein FIG. 6(a) is a top view of the semiconductor structure, and FIG. 6(b) is a cross-sectional view taken along line A-A' in FIG. 6(a);

FIG. 7 is a cross-sectional view of the semiconductor structure after source/drain regions are formed;

FIG. 8 is a cross-sectional view of the semiconductor structure after a contact etching stop layer (CESL) and an interlayer dielectric (ILD) layer are formed;

FIG. 9 is a cross-sectional view of the semiconductor structure after gate trenches are formed;

FIG. 10 is a cross-sectional view of the semiconductor structure after an interfacial layer, a high-k dielectric layer and a metal gate body are formed; and FIG. 11 is a cross-sectional view of the semiconductor structure after contact plugs are formed.

DETAILED DESCRIPTION

Figure 1:
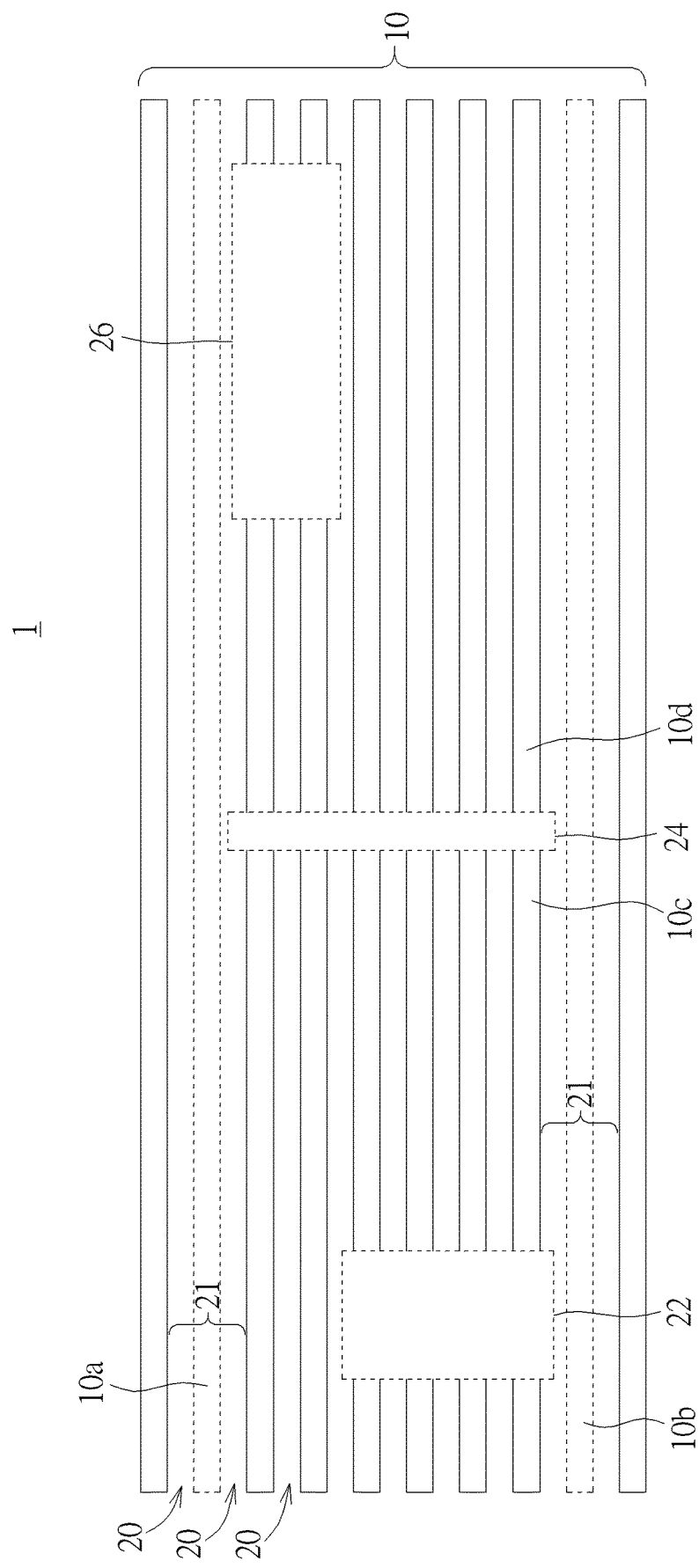
FIG. 1 is a schematic top view, illustrating the method of forming a plurality of fin sections or fin segments on semiconductor substrates by multiple-patterning technology.

In the following detailed description, reference is made to the accompanying drawings which form a part hereof, and in which is shown, by way of illustration of specific embodiments in which the invention may be practiced. These embodiments are described in sufficient detail to enable those skilled in the art to practice the invention. Other embodiments may be utilized and that structural, logical and electrical changes may be made without departing from the spirit and scope of the present invention.

The drawings showing embodiments of the apparatus are not to scale and some dimensions are exaggerated in the figures for clarity of presentation. Also, where multiple embodiments are disclosed and described as having some features in common, like or similar features will usually be described with like reference numerals for ease of illustration and description thereof.

Figure 2:
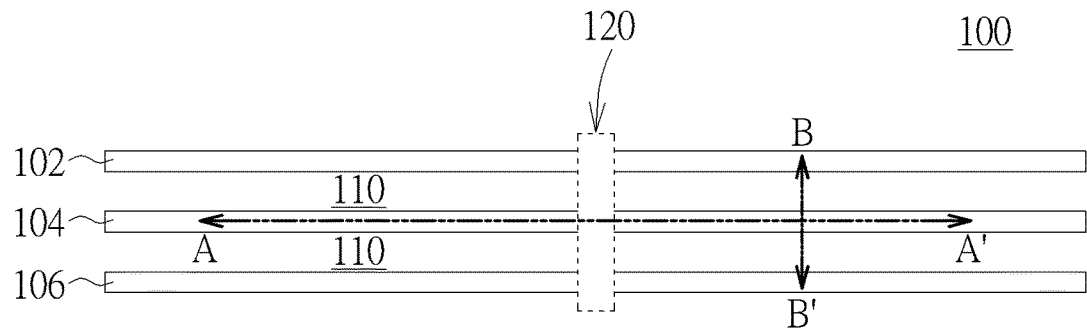
Figure 2:
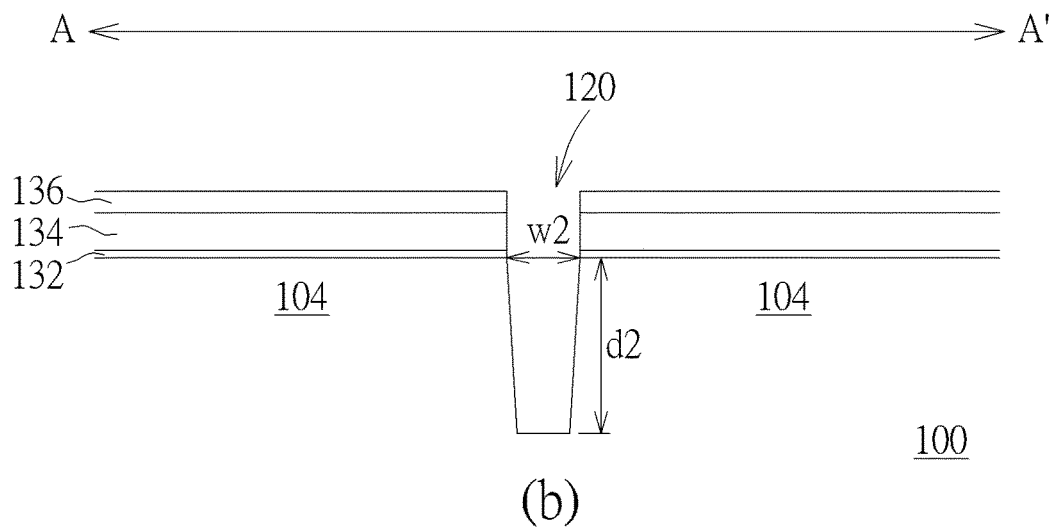
Figure 2:
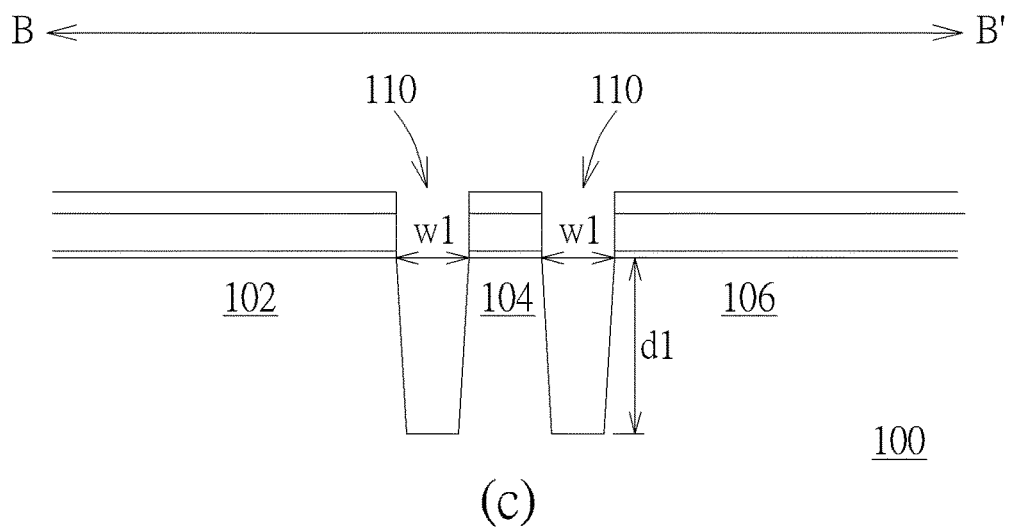

Please refer to FIG. 2, which is a schematic diagram of the semiconductor structure after the trenches and fin structures are formed on the substrate, wherein FIG. 2(a) is a top view of the semiconductor structure, FIG. 2(b) is a cross-sectional view taken along line A-A' in FIG. 2(a), and FIG. 2(c) is a cross-sectional view taken along line B-B' in FIG. 2(a). Although line A-A' shown in FIG. 2(a) is extending along the fin structure 104, it should be understood that the trench 120 may be formed extending to fin structures 102 and 106 neighboring the fin structure 104, and therefore the following description and diagrams as shown in FIG. 4 to FIG. 11 are also applicable to illustrate the cross-sectional structures of the fin structure 102 and 106 along their longitudinal directions.

As shown in FIG. 2(a), a substrate 100 is provided. The substrate 100 may comprise a silicon substrate, a silicon-containing substrate or a silicon-on-insulator (SOI) substrate, but not limited thereto. A pad oxide 132, a pad nitride 134 and another pad oxide 136 may be formed successively on the substrate 100. After that, the inter-fin trenches 110 are formed in the substrate 100 to define the fin structures 102, 104 and 106, and the trench 120 is formed to divide each of the fin structures 102, 104 and 106 into at least two fin segments, as shown in FIG. 2(a). As shown in FIG. 2(a) and FIG. 2(c), the fin structures 102, 104 and 106 may be parallel and are separated from each other by being encompassed by the inter-fin trenches 110 along their longitudinal direction. According to the embodiment, the trench 120 may be formed in the substrate 100 and extends in a direction orthogonal to the longitudinal direction of the fin structures 102, 104 and 106. More particularly, as shown in FIG. 2(a) and FIG. 2(b), the trench 120 may cut into the fin structures 102, 104 and 106 and the inter-fin trenches 110, to divide each of the fin structures 102, 104 and 106 into at least two fin segments.

According to the embodiment, a patterning process, such as a photolithography-etching process (PEP), may be carried out to form the inter-fin trenches 110 and define the fin structures 102, 104 and 106 on the substrate 100 thereby. The inter-fin trenches 110 may be formed by etching the substrate 100 through a patterned hard mask layer (not shown). Multiple-patterning technology, such as pitch scaling technology or sidewall image transfer (SIT) technology, may be utilized to form the fin structures arranged in close proximity. To simplify the disclosure, the patterning process to form the fin structures 102, 104 and 106 will not be illustrated further in detail herein. After the inter-fin trenches 110 and the fin structures 102, 104 and 106 are formed, a fin cut process, such as single diffusion break (SDB) process, are carried out to form the trench 120. The trench 120 may cut into the fin structures 102, 104 and 106 and divide the fin structures 102, 104 and 106 into at least two fin segments respectively. According to an embodiment, an organic planarization layer (OPL) or an organic dielectric layer (ODL) may be applied onto the substrate 100, filling the inter-fin trench 110 and covering the fin structures 102, 104 and 106 before the fin cut process. Another patterning process may be performed on the substrate 100, wherein a pre-determined region of the trench 120 may be defined and then be etched. According to an embodiment, the depth d2 of the trench 120 may be substantially equal to the depth d1 of the inter-fin trench 110. According to another embodiment, the width w2 of the trench 120 may be substantially smaller than or equal to the width w1 of the inter-fin trench 110.

Figure 3:
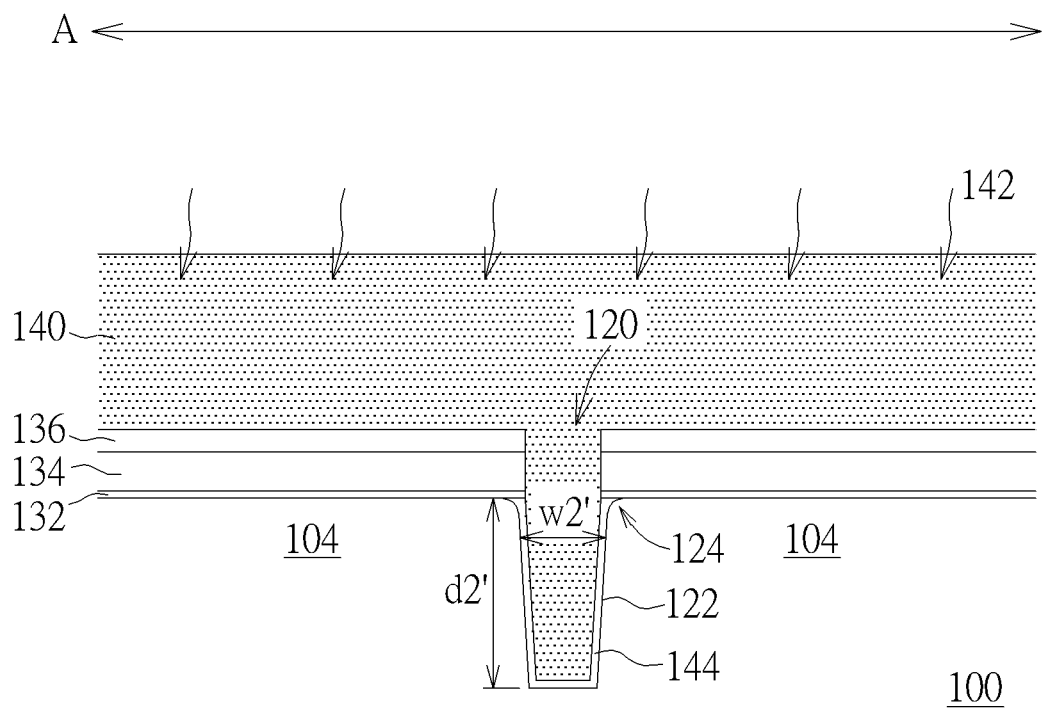
Figure 4:
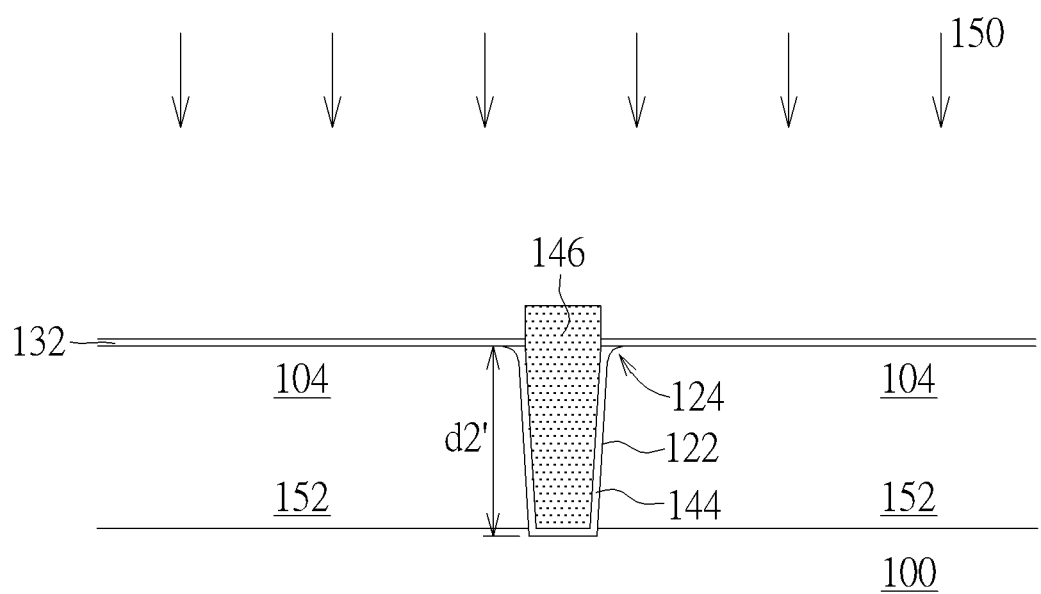
Figure 5:
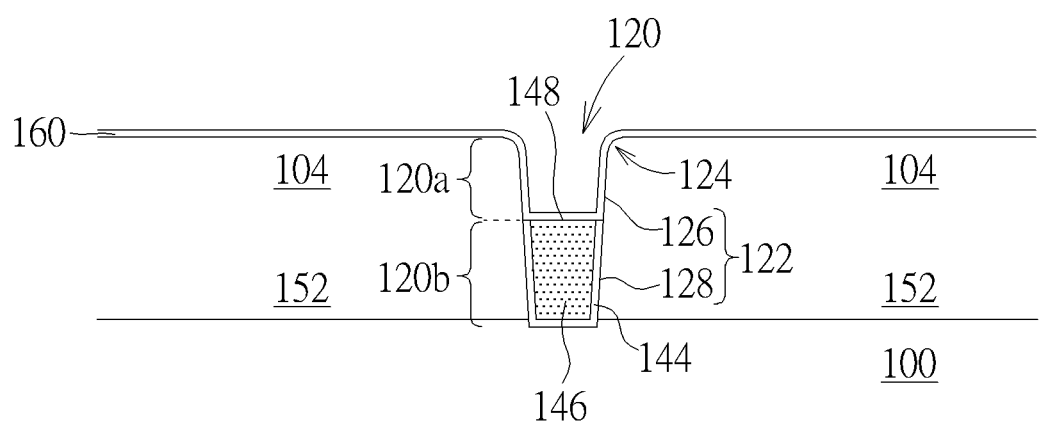

FIG. 3 to FIG. 5 are also cross-sectional diagrams taken along line A-A' in FIG. 2(a), showing the cross-sectional structures of the fin structure 104 along its longitudinal direction during the following process.

Please refer to FIG. 3. After the trench 120 has been formed, a liner (not shown) including silicon oxide or silicon nitride may be formed optionally. After that, a first dielectric material layer 140, such as silicon oxide, may be formed, blanketly covering the fin structure 104 and filling the trench 120. It should be understood by those skilled in the art without the need to be depicted in FIG. 3 that the inter-fin trenches 110 are also filled by the first dielectric material layer 140. According to an embodiment, the first dielectric material layer 140 may be formed by flowable chemical vapor deposition (FCVD) process for its superior gap filling capability for a high aspect ratio trench. Subsequently, an annealing process 142 may be performed to solidify and densify the first dielectric material layer 140. According to the embodiment, during the annealing process 142, the substrate 110 which is in direct contact with the first dielectric material layer 140 may be further oxidized by the oxygen comprised in the first dielectric material layer 140, and therefore forming an oxide layer 144 conformally covering the bottom, the sidewall and the top corner of the trench 120. As a result, as shown in FIG. 3, after the annealing process 142, the top corner of the trench 120 may become a rounded top corner 124 and the sidewall may become an expanded sidewall 122 (expand outwardly to the substrate 100). The width and depth of the trench 120 after the annealing process 142 may become w2' and d2', including the thickness of the oxide layer 144.

Please refer to FIG. 4. Afterward, a chemical mechanical polishing (CMP) process or an etching back process may be performed to remove the excess first dielectric material layer 140 outside the trench 120 until the pad oxide 136 is exposed, and form a first dielectric layer 146 filling the trench 120. As shown in FIG. 4, the pad oxide 136 and the pad nitride 134 on the fin structure 104 may be removed successively, and therefore the first dielectric layer 146 may protrude a small amount from the top surface of the fin structure 104. The pad oxide 132 may not be removed and used as a buffer layer in the following process. Afterward, an ion implantation process 150 may be performed to implant impurities with certain species and dosages into the fin structure 104, to form the well region 152. According to an embodiment, the depth d2' of the trench 120 may be larger than or equal to the depth of the well region 152.

Please refer to FIG. 5. Subsequently, an etching back process may be carried out to remove a portion of the first dielectric layer 146 from an upper portion 120a of the trench 120. The remaining first dielectric layer 146 only fills a lower portion 120b of the trench. According to an embodiment, the pad oxide 132 on the fin structure 104 and the oxide layer 144 on the top corner 124 and the upper sidewall 126 of the upper portion 120a of the trench 120 may be removed simultaneously during the etching back process, and therefore the upper surface of the fin structure 104, the top corner 124 and the upper sidewall 126 of the trench 120 are exposed. An atomic layer deposition (ALD) process may be performed to form a gate dielectric layer 160, such as silicon oxide, conformally covering the substrate 100. More particularly, the gate dielectric layer 160 covers the upper surface of the fin structure 104, the top corner 124 and the upper sidewall 126 of the trench 120, and the upper surface 148 of the first dielectric layer 146. According to the embodiment, by using ALD process to form the gate dielectric layer 160, further oxidation and consumption of the substrate 100 at the top corner 124 and the upper sidewall 126 of the trench 120 may be prevented.

Figure 6:
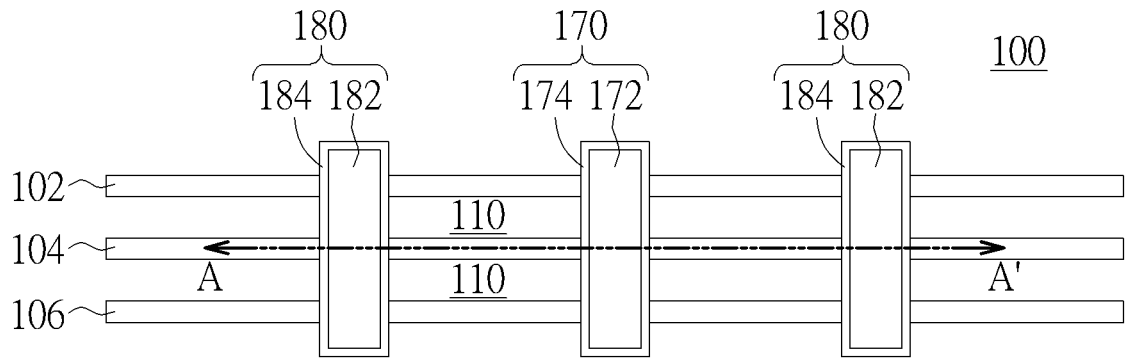
Figure 6:
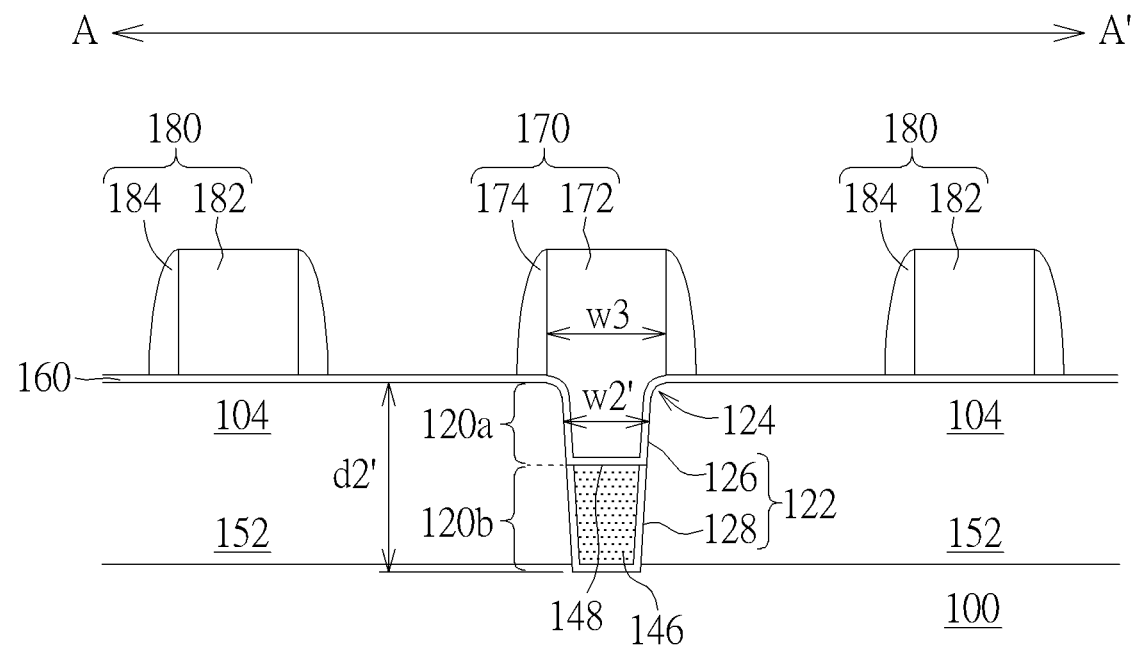

Please refer to FIG. 6, which is a schematic diagram of the semiconductor structure after gate structures are formed on the substrate, wherein FIG. 6(a) is a top view of the semiconductor structure, and FIG. 6(b) is a cross-sectional view taken along line A-A' in FIG. 6(a).

After the gate dielectric layer 160 is formed, the gate structures 170 and 180 are formed across the fin structures 102, 104 and 106 orthogonally and extending along a direction perpendicular to the longitudinal directions of the fin structures 102, 104 and 106. The gate structure 170 comprises a gate body 172 and a spacer 174, and is formed atop the trench 120 and completely covers the trench 120. The gate structure 180 comprises a gate body 182 and a spacer 184, and is formed on each of the fin segments of the fin structure 104 separated by the trench 120. According to one embodiment, the process of forming the gate structures 170 and 180 may include forming a gate body material layer, such as poly silicon or amorphous silicon, blanketly covering the fin structure 102, 104 and 106. A planarization process and a following patterning process may then be performed to form the gate bodies 172 182. After that, the spacers 174 and 184, such as oxide spacer or nitride spacer, are formed on two opposite sidewalls of the gate bodies 172 and 182 respectively. As shown in FIG. 6(b), the gate body 172 is aligned with and completely covers the trench 120 and fills into the upper portion 120a of the trench 120. In other words, the adjacent distal ends of the fin segments separated by the trench 120 formed in the structure 104 are completely covered by the gate body 172 and therefore not exposed. As shown in FIG. 6(b), the gate dielectric layer 160 is disposed (or sandwiched in) between the gate body 172, the upper surface 148 of the first dielectric layer 146, the top corner 124 and the upper sidewall 126 of the trench 120, and approximately has a shape of upside down S2. According to an embodiment, the width w3 of the gate body 172 may be larger than or equal to the width w2' of the trench 120. According to an embodiment, the gate body 172 may have a bottom surface lower than the upper surface of the fin structure 104 by about 50 to 100 angstroms. The gate dielectric layer 160 and the oxide layer 144 are aligned on the sidewall 122 of the trench 120 wherein the gate dielectric layer 160 covers the upper sidewall 126 of the trench 120 and is disposed above the oxide layer 144 covering the lower sidewall 126 of the trench 120.

FIG. 7 to FIG. 11 are also cross-sectional diagrams taken along line A-A' in FIG. 6(a), showing the cross-sectional structures of the fin structure 104 along its longitudinal direction during the following process.

Figure 7:
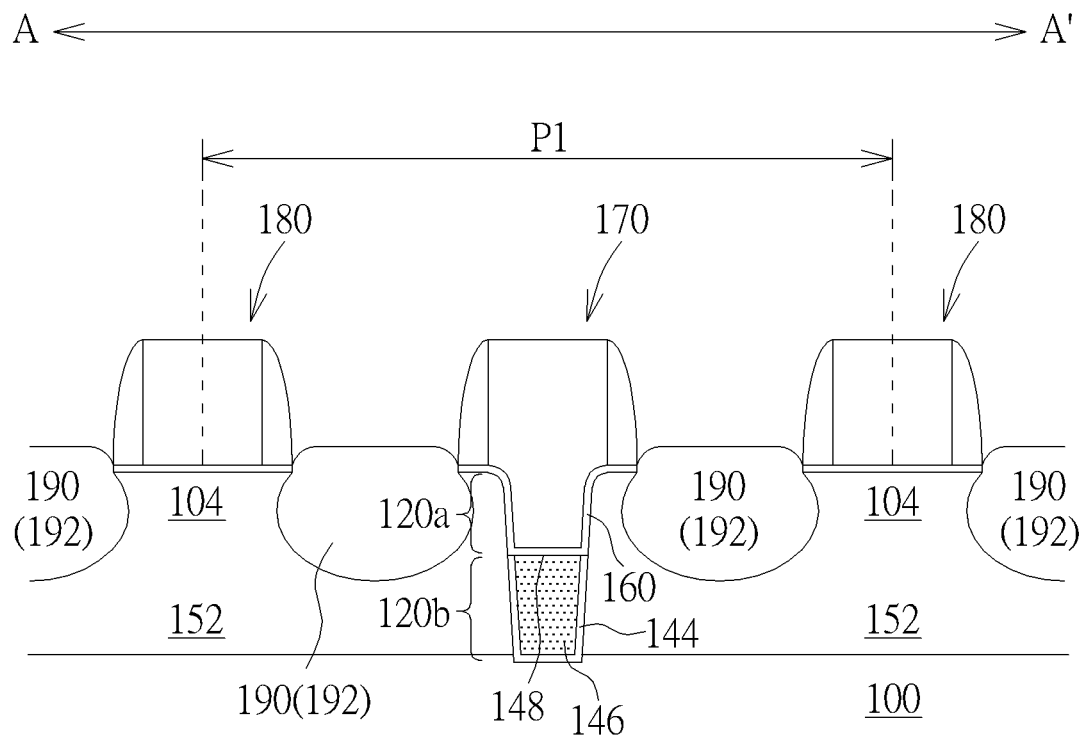

Please refer to FIG. 7. After forming the gate structures 170 and 180, subsequently, an epitaxial layer 190 is formed in the fin structure 104 at each side of the gate structures 170 and 180. The epitaxial layer 190 may form the source/drain region 192 of the device in the later process. The method of forming the epitaxial layers 190 may include, first, forming a recess in the fin structure 104 at each side of the gate structures 170 and 180 in a manner of self-aligning with the gate structures 170 and 180. After that, an epitaxial growing process may be performed to form the epitaxial layer 190 in the recess. The epitaxial layers 190 may be formed comprising impurities having particular species and pre-determined concentrations suitable to form the source/drain region 192 by, for example, in-situ doping processes, or post-epitaxial implant processes. According to an embodiment, the source/drain region 192 is adjacent to the upper sidewall 126 of the trench 120, but not in direct contact with the trench 120. The source/drain region 192 may have a bottom surface lower than the upper surface 148 of the first dielectric layer 146. It is noteworthy that, as shown in FIG. 7, by forming the gate dielectric layer 160 and the gate body 172 completely covering the trench 120 and filling the upper portion 120a of the trench 120 before the epitaxial growing process, the epitaxial bridging between the epitaxial layers 190 formed in the adjacent distal ends of the fin segments at two sides of the trench 120 may be prevented. Furthermore, by self-aligning with the gate structure 170, the recess formed in the fin segment of the fin structure 104 at each side of the trench 120 is spaced from the sidewall 122 of the trench 120 by a certain distance. The sidewall 122 of the trench 120 would not be exposed from the recess during the epitaxial growing process and therefore the facet defect may be avoided. Furthermore, by forming the gate structure 170 completely covering the trench 120 and the two adjacent distal ends of the fin segments of the fin structure 104 at the same time, a smaller pitch P1 between the gate structures 180 formed respectively on the fin segments spaced apart by the trench 120 may be obtained, and therefore a smaller layout area may be achieved.

Figure 8:
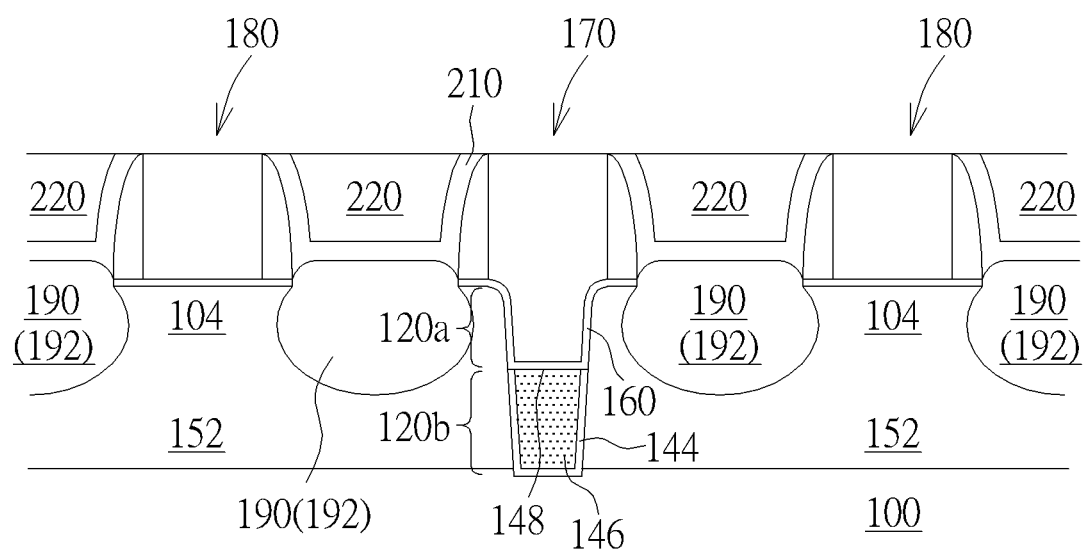

Please refer to FIG. 8. Afterward, a contact etching stop layer (CESL) 210 and an interlayer dielectric layer 220 may be formed blanketly covering the fin structure 104, the source/drain regions 192 and the gate structures 170 and 180. A planarization process may be performed to remove a portion of the contact etching stop layer 210 and a portion of the interlayer dielectric layer 220 to expose the top surface of the gate structures 170 and 180.

Figure 9:
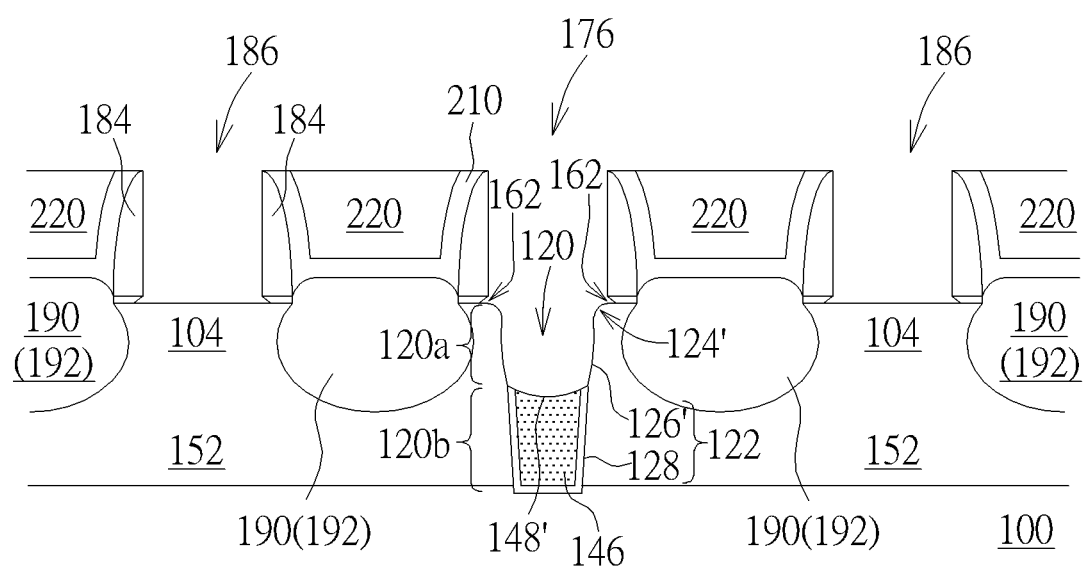
Figure 10:
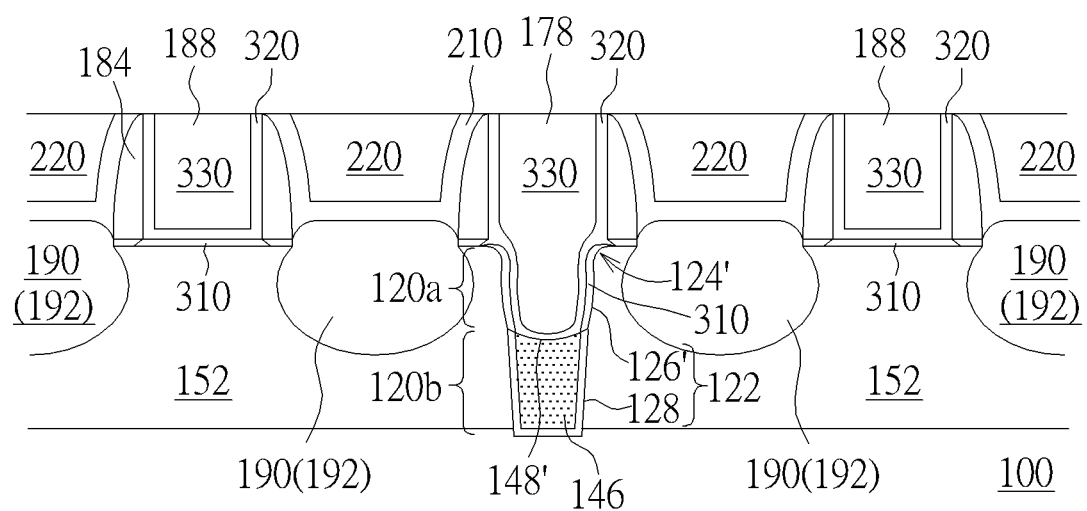

FIG. 9 and FIG. 10 are cross-sectional diagrams, illustrating performing the replacement metal gate (RMG) process to form the metal gate structures.

Please refer to FIG. 9. Subsequently, the gate bodies 172 and 182 are removed from the exposed top surface of the gate structures 170 and 180, to form the gate trenches 176 and 186 respectively. According to the embodiment, a portion of the gate dielectric layer 160 may be exposed from the gate trenches 176 and 186 respectively, and then be removed by, for example, a chemical oxide removal (COR) process. According to the embodiment, during the chemical oxide removal process, a small amount of the substrate 100 and a small amount of the first dielectric layer 146 may also be etched and removed from the top corner 124, the upper sidewall 126 of the trench 120 and the upper surface 148 of the first dielectric layer 146, and therefore form an more rounded top corner 124', a concave upper sidewall 126' of the trench 120 and a concave upper surface 148' of the first dielectric layer 146. As shown in FIG. 9, the more rounded top corner 124', the concave upper sidewall 126' of the trench 120 and the concave upper surface 148' of the first dielectric layer 146 are exposed from the gate trench 176. It should be noticed that although the concave upper sidewall 126' and the source/drain region 192 may be a little closer, they are still not in direct contact with each other and are spaced apart by a certain distance. Similarly, although the concave upper surface 148' of the first dielectric layer 146 may be a little deeper from the upper surface of the fin structure 104, the bottom surfaces of the source/drain regions 192 are still lower than the concave upper surface 148'. According to the embodiment, as shown in FIG. 9, a distal end of the gate dielectric layer 160 exposed from the gate trench 176 may also be etched by the chemical oxide removal process. The gate dielectric layer 160 is therefore slightly shortened and forms an undercut 162 adjacent to the bottom of inner sidewall of the spacer 174, that is, the sidewall of the gate trench 176, and the top corner 124'.

Please refer to FIG. 10. Thereafter, a thermal oxidation process may be performed to form an interfacial layer (IL) 310, such as silicon oxide, conformally covering the fin structure 104, the top corner 124' and the upper sidewall 126' of the trench 120. Subsequently, a high-k dielectric layer 320 may be formed conformally covering the interfacial layer 310, the upper surface 148' of the first dielectric layer 146 and the sidewalls of the gate trenches 176 and 186. After that, the metal gate structures 178 and 188 are obtained by forming the metal gate bodies 330 filling the gate trenches 176 and 186 and the upper portion 120a of the trench 120. The metal gate body 330 filling the gate trench 176 and the upper portion 120a of the trench may have a bottom surface lower than the upper surface of the fin structure 104 by about 50 to 100 angstroms. According to one embodiment, the metal gate structure 178 may be a dummy gate which is not electrically connected with other circuits, but not limited thereto. In other embodiments, the metal gate structure 178 may connect to the gate structure of other fin FETs, or may be a local inter-connecting structure which is electrically connected with an outer circuit. The metal gate structure 178, and the first dielectric layer 146, the interfacial layer 310 and the high-k dielectric layer 320 disposed in the trench 120 in the fin structure 104 form a single diffusion break (SDB) isolation structure.

According to the embodiment as shown in FIG. 10, the semiconductor structure provided by the present invention comprises the fin structure 104, the trench 120 formed in the fin structure 104, and the metal gate structure 178 disposed atop and aligned with the trench 120, wherein the upper portion 120a of the trench 120 has a concave upper sidewall 126' and is filled by the metal gate body 330 of the metal gate structure 178, and the lower portion 120b of the trench 120 has a straight lower sidewall 128 and is filled by the first dielectric layer 146. The trench 120 further has a rounded top corner 124'. The straight lower sidewall 128, the concave upper sidewall 126' and the rounded top corner 124' form the unique profile of the sidewall 122' of the trench 120. The interfacial dielectric layer 310 and the high-k dielectric layer 320 cover the rounded top corner 124' and the concave upper sidewall 126' of the trench 120, and are sandwiched in between the metal gate body 330 and the rounded top corner 124', concave upper sidewall 126' of the trench 120, wherein the high-k dielectric layer further covers the upper surface 148' of the first dielectric layer 146 and is further sandwiched in between the gate body 330 and the upper surface 148', and approximately has a shape of upside down Ω. The high-k dielectric layer may extend upwardly and disposed between the metal gate body 330 and the spacer 174. It is noteworthy that a portion of the interfacial layer 310 and high-k dielectric layer 320 may have an extending portion along the undercut 162 of the gate dielectric layer 160 at the bottom of the spacer 174. As shown in FIG. 10, a portion of the interfacial layer 310 and high-k dielectric layer 320 adjacent to the top corner 124' and the bottom of the inner sidewall of the spacer 174 may have a bird's peak profile.

Figure 11:
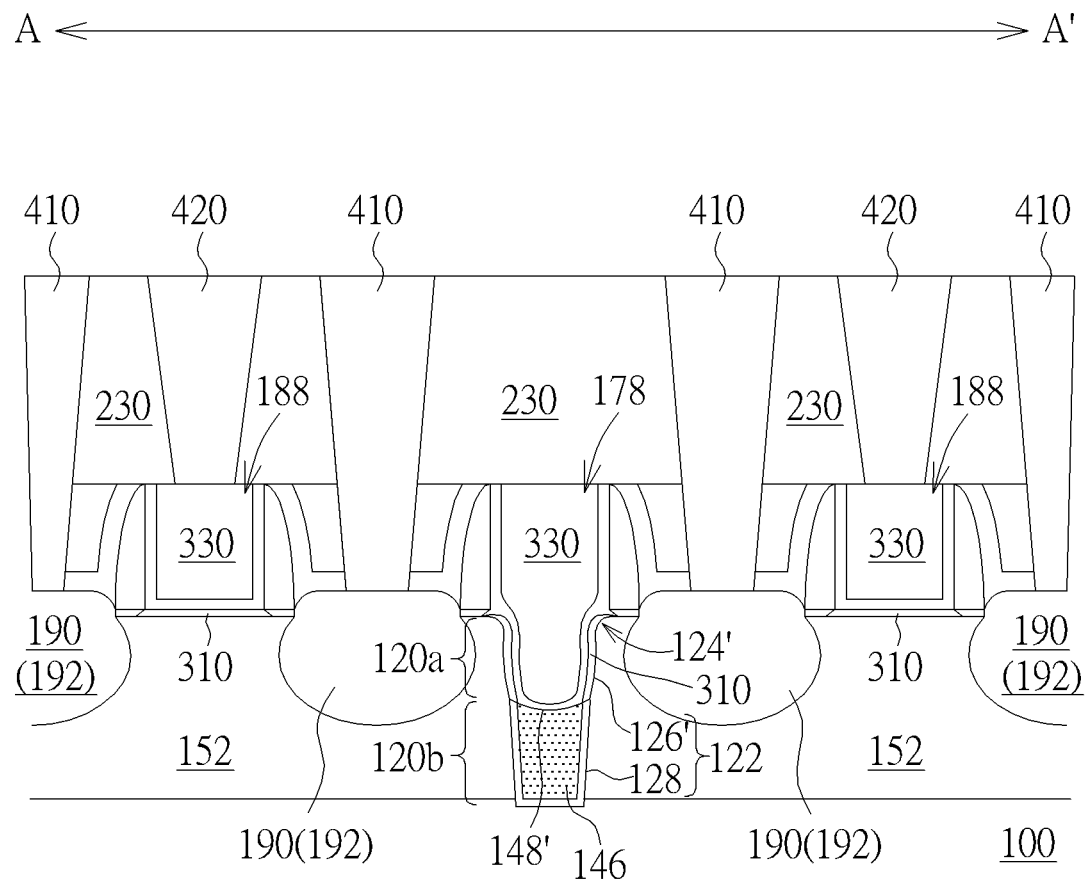

Please refer to FIG. 11. Another interlayer dielectric layer 230 may be formed, covering the interlayer dielectric layer 220 and the metal gate structures 178 and 188. Contact plugs 410, 420 may be formed and electrically connect with the source/drain regions 192 and the metal gate structure 188 respectively.

By applying the isolation structure and manufacturing process according to the present invention, a contentious fin structure may be divided into several isolated fin segments for the following process to form individual fin FETs thereon according to the layout design. The small width of the isolation structure may achieve a smaller layout area. Moreover, by covering the adjacent distal ends of the fin segments, the epitaxial bridging issue is prevented. Furthermore, the facet-defect formed during the epitaxial growing is also prevented, and the yield of the source/drain contact plugs is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor structure, comprising:
    forming a fin structure on a substrate;
    forming a trench in the fin structure, wherein the trench has a top corner, an upper portion having an upper sidewall, a lower portion having a lower sidewall;
    forming a first dielectric layer filling the lower portion of the trench; and
    forming an interfacial layer covering the top corner and the upper sidewall of the trench; and
    forming a high-k dielectric layer directly covering the interfacial layer and an upper surface of the first dielectric layer.

2. The method of forming a semiconductor structure according to claim 1, wherein the top corner of the trench is a rounded top corner, the lower sidewall of the trench is a straight lower sidewall, and the upper surface of the first dielectric layer is a concave upper surface.

3. The method of forming a semiconductor structure according to claim 2, wherein a portion of the high-k dielectric layer adjacent to the top corner of the trench comprises a bird's peak profile.

4. The method of forming a semiconductor structure according to claim 1, wherein forming the fin structure on the substrate comprises:
    forming an inter-fin trench, encompassing the fin structure along the longitudinal direction of the fin structure.

5. The method of forming a semiconductor structure according to claim 4, wherein the trench and the inter-fin trench have the same depth.

6. The method of forming a semiconductor structure according to claim 1, wherein forming the first dielectric layer comprises:
    forming a first dielectric material layer on the substrate and performing an annealing process.

7. The method of forming a semiconductor structure according to claim 1, further comprising the following steps after forming the first dielectric layer:
    forming a gate dielectric layer conformally covering the fin structure, the top corner and the upper sidewall of the trench and the upper surface of the first dielectric layer;
    forming a gate body disposed on the gate dielectric layer, aligned with the trench and completely covering the trench; and
    forming a spacer on two opposite sidewalls of the gate body.

8. The method of forming a semiconductor structure according to claim 7, wherein forming the interfacial layer and the high-k dielectric layer comprises:
    removing the gate body to form a gate trench aligned with the trench and exposing a portion of the gate dielectric layer;
    removing the exposed first dielectric layer and exposing the top corner and the upper sidewall of the trench and the upper surface of the first dielectric layer;
    forming the interfacial layer covering the exposed top corner and the upper sidewall of the trench; and
    forming the high-k dielectric layer covering the interfacial layer and the exposed upper surface of the first dielectric layer.

9. The method of forming a semiconductor structure according to claim 7, further comprising the following step after forming the high-k dielectric layer:
    forming a metal gate body, filling the gate trench and the upper portion of the trench, wherein a bottom surface of the metal gate body is lower than the fin structure by 50 to 100 angstroms.

10. The method of forming a semiconductor structure according to claim 1, further comprising forming a source/drain region in the fin structure and adjacent to each side of the trench.

* * * * *

UNITED STATES PATENT AND TRADEMARK OFFICE
CERTIFICATE OF CORRECTION

PATENT NO. : 10,658,458 B2
APPLICATION NO. : 16/028386
DATED : May 19, 2020
INVENTOR(S) : Tseng et al.

Page 1 of 1

It is certified that error appears in the above-identified patent and that said Letters Patent is hereby corrected as shown below:

On the Title Page

Item (73), correct the name of the assignee from "UNITED MICROELECTRONCIS CORP." to --UNITED MICROELECTRONICS CORP.--.

Signed and Sealed this
Seventh Day of July, 2020

Andrei Iancu
*Director of the United States Patent and Trademark Office*